US010854280B2

(12) United States Patent
Singh et al.

(10) Patent No.: US 10,854,280 B2
(45) Date of Patent: Dec. 1, 2020

(54) READ ASSIST CIRCUITRY FOR MEMORY APPLICATIONS

(71) Applicant: ARM Limited, Cambridge (GB)

(72) Inventors: Abhairaj Singh, Chandigarh (IN); Vivek Asthana, Noida (IN); Monu Rathore, Delhi (IN); Ankur Goel, Noida (IN); Nikhil Kaushik, Noida (IN); Rachit Ahuja, Noida (IN); Rahul Mathur, Austin, TX (US); Bikas Maiti, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 54 days.

(21) Appl. No.: 15/691,001

(22) Filed: Aug. 30, 2017

(65) Prior Publication Data

US 2019/0066772 A1 Feb. 28, 2019

(51) Int. Cl.
*G11C 11/408* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ..... G11C 11/419; G11C 8/08; G11C 11/4085; G11C 11/418
See application file for complete search history.

(56) References Cited

U.S. PATENT DOCUMENTS

| | | | |
|---|---|---|---|
| 2003/0059997 A1* | 3/2003 | Bedarida | G11C 7/1051 438/200 |
| 2005/0278592 A1 | 12/2005 | Yamada et al. | |
| 2007/0030741 A1* | 2/2007 | Nii | G11C 5/06 365/189.11 |
| 2008/0151604 A1* | 6/2008 | Suzuki | G11C 11/412 365/154 |
| 2013/0141962 A1* | 6/2013 | Liaw | G11C 11/412 365/154 |
| 2014/0112065 A1* | 4/2014 | Tanabe | G11C 11/419 365/154 |
| 2014/0241089 A1* | 8/2014 | Holla | G11C 11/417 365/206 |
| 2017/0301396 A1* | 10/2017 | Dhori | G11C 11/419 |
| 2018/0166127 A1* | 6/2018 | Pathak | G11C 7/04 |

FOREIGN PATENT DOCUMENTS

EP 2092527 B1 3/2016

* cited by examiner

*Primary Examiner* — Khamdan N. Alrobaie
(74) *Attorney, Agent, or Firm* — Pramudji Law Group PLLC; Ari Pramudji (57) ABSTRACT

Various implementations described herein are directed to an integrated circuit having a wordline driver coupled to a bitcell via a wordline. The integrated circuit may include a read assist transistor coupled to the wordline between the wordline driver and the bitcell. While activated, the read assist transistor may generate an adaptive underdrive on the wordline, the level of which depends on the process, temperature and voltage of operation of the memory, when the wordline is selected and driven by the wordline driver.

19 Claims, 10 Drawing Sheets

READ ASSIST CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in an attempt to inhibit degradation of read and write margins, some memory devices have attempted to support read and write operations by delaying data access signals in the signal path to recover read margins. This delay typically results in a timing penalty for data access. Similarly, in an attempt to recover write margins, some memory devices have attempted to increase an amount of write assist, which typically leads to increased area penalty, power penalty and implementation complexities. Thus, there exists a need to improve integrated circuitry to enable recovery of degraded read and write margins in a more efficient manner.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to read assist circuitry for memory applications, wherein the read assist circuitry may be adaptive to pressure, voltage and temperature (PVT). For instance, under some operating conditions, adaptive read assist circuitry may provide maximum wordline underdrive (WLUD) at a PVT corner critical for ADM (Access Disturb Margin), while the adaptive read assist circuitry may provide minimum underdrive penalty in corners critical for read and write margins. Hence, adaptive read assist circuitry may improve performance. Generally, ADM refers to a bitcell parameter that may be used to determine read stability of bitcells in memory applications, such as, e.g., SRAM memory applications.

Various implementations of read assist circuitry for memory applications will now be described in greater detail herein with reference to FIGS. 1A-4.

Figure 1A:
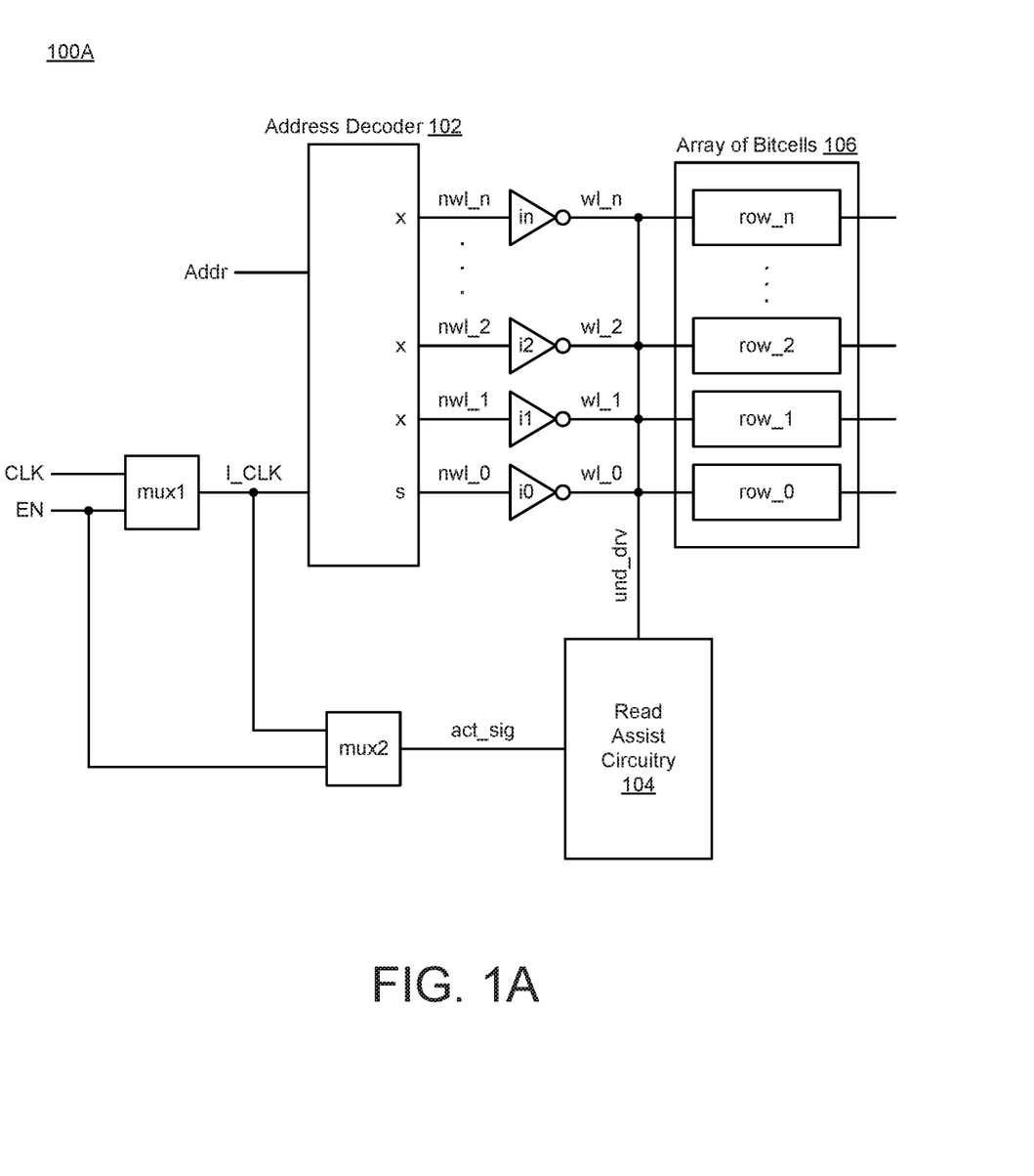
FIGS. 1A-1C illustrate various diagrams of memory circuitry in accordance with various implementations described herein.
Figure 1B:
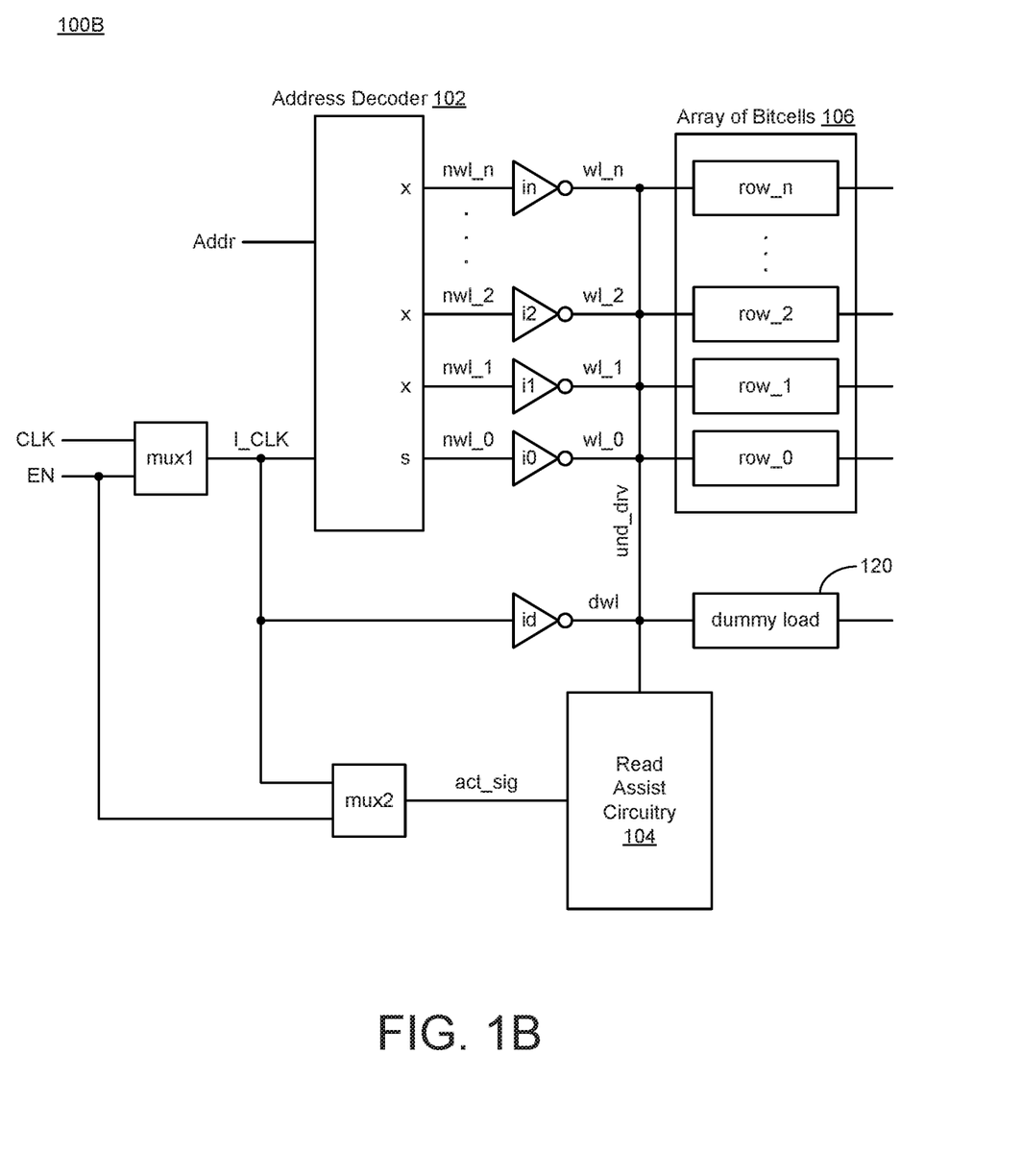
Figure 1C:
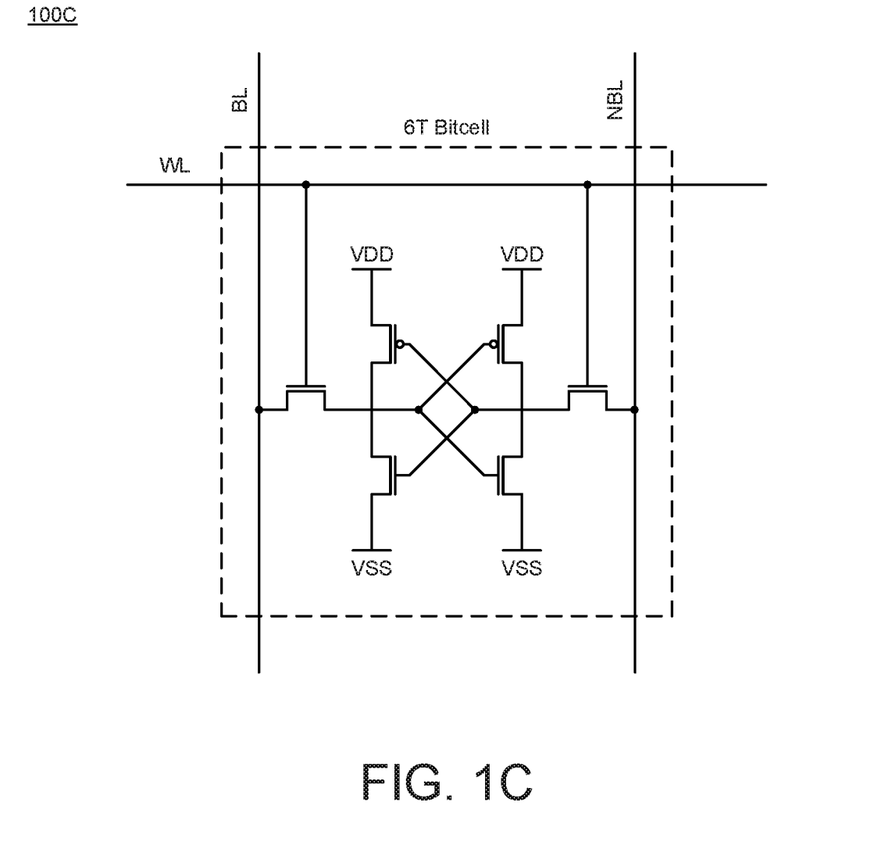

FIGS. 1A-1C illustrate various diagrams of memory circuitry in accordance with various implementations described herein. In particular, FIG. 1A illustrates a block diagram of memory circuitry 100A, FIG. 1B illustrates a block diagram of memory circuitry 100B having a dummy load, and FIG. 1C illustrates a schematic diagram of a bitcell 100C, such as, e.g., a 6T bitcell.

As shown in FIG. 1A, the memory circuitry 100 may include various circuitry including an address decoder 102, one or more multiplexors (e.g., mux1, mux2), and read assist circuitry 104. The memory circuitry 100 may include an array of bitcells 106 having multiple rows of bitcells row_0, row_1, row_2, . . . , row_n. The memory circuitry 100 may also include a number of wordlines (e.g., nwl_0, nwl_1, nwl_2, . . . , nwl_n) that are coupled between the address decoder 102 and corresponding rows of bitcells row_0, row_1, row_2, . . . , row_n for access to each of the bitcells based on a selected wordline. Further, unselected wordlines are represented with an "x". As shown, each of the wordlines nwl_0, nwl_1, nwl_2, . . . , nwl_n have a corresponding wordline driver (e.g., inverters i0, i1, i2, . . . , in) coupled thereto to provide complementary wordlines signals (e.g., wl_0, wl_1, wl_2, . . . , wl_n) to the corresponding rows of bitcells row_0, row_1, row_2, . . . , row_n.

The memory circuitry 100 may receive a clock signal CLK, a chip enable signal EN, and an address signal Addr. The first multiplexer mux_1 may receive the clock signal CLK and the chip enable signal EN and then provide an internal clock signal I_CLK to the address decoder 102. The address decoder 102 may receive multiple signals including the address signal Addr and the internal clock signal I_CLK and then access a selected wordline (e.g., nwl_0) based on the received address signal Addr. As shown, the selected wordline is represented with an "s", and the unselected wordlines are represented with an "x". Further, the second multiplexor mux2 may receive the internal clock signal I_CLK and the chip enable signal EN and then provide an activation signal act_sig to the read assist circuitry 104. Based on the activation signal act_sig, the read assist circuitry 104 may provide an underdrive signal und_dry to the selected wordline (e.g., wl_0).

In some implementations, FIG. 1A illustrates clock dependency of wordline generation and read assist signal generation. With use of the first multiplexer mux1, the clock signal CLK may be mixed with the chip enable signal EN to generate the internal clock signal I_CLK. With use of the address decoder 102, the internal clock signal I_CLK may be mixed with the address (e.g., via a decoded address) to select a row of bitcells 106 by activating one of the nwl rows (e.g., nwl0 is selected in FIG. 1A). The read assist signal rd_ast may be generated in parallel to enable the read assist circuitry 104, which may result with no timing penalty in access time.

FIG. 1B illustrates a block diagram of memory circuitry 100B having a dummy load 120. The memory circuitry 100B of FIG. 1B is similar to the memory circuitry 100A of FIG. 1A with the addition of a dummy wordline dwl, a dummy wordline driver id, and the dummy load 120. As shown, the internal clock signal I_CLK is input to the dummy wordline driver (e.g., inverter id) via the dummy wordline dwl, which is coupled to the underdrive signal line und_dry and the dummy load 120.

FIG. 1C illustrates a schematic diagram of a bitcell 100C, such as, e.g., a 6T bitcell, that may be used for each bitcell in the array of bitcells 106. Each bitcell may be referred to as a memory cell, and each bitcell may be configured to store at least one data bit value (e.g., a data value associated with logical '0' or '1'). Each row of bitcells row_0, row_1, row_2, . . . , row_n in the array of bitcells 106 may include any number of bitcells or memory cells arranged in various configurations, such as, e.g., a two-dimensional (2D) memory array having columns and rows of multiple bitcells arranged in a 2D grid pattern with 2D indexing capabilities. Each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the array of bitcells 106 may be accessed with a wordline WL and complementary bitlines BL, NBL.

As shown in FIG. 1C, static RAM bitcells may include 6T bitcells, which may have access ports controlled by word-lines. In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in a left half array and a right half array.

The various memory circuitry 100A, 100B including the bitcell 100C may be implemented as an integrated circuit (IC) with various types of memory circuitry, such as, e.g., random access memory (RAM), and/or any other types of memory, including any type of volatile memory and non-volatile memory. The memory circuitry 100 may be implemented as an IC with single and/or dual rail memory architectures. The memory circuitry 100 may also be integrated with computing circuitry and related components on a single chip. Further, the memory circuitry 100 may be implemented in an embedded system for various types of electronic, mobile, and/or biometric applications.

Figure 2A:
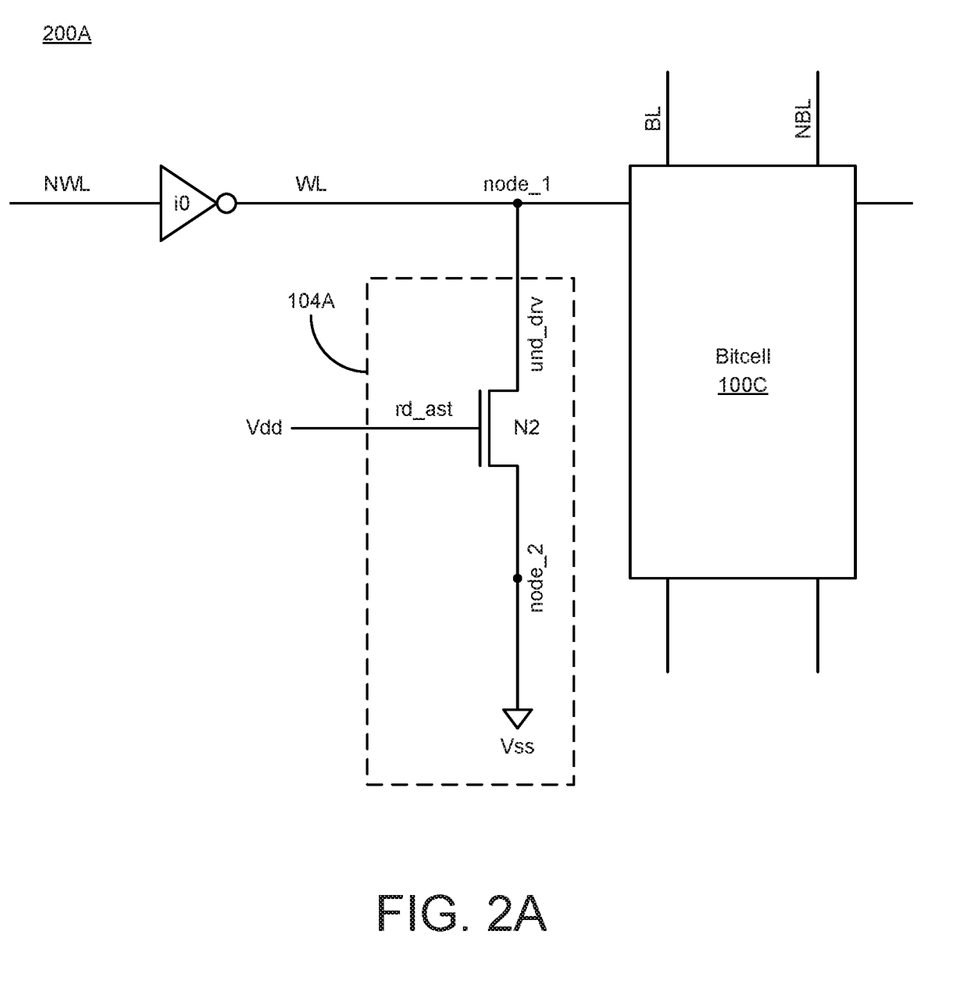
FIGS. 2A-2D illustrate various diagrams of read assist circuitry in accordance with various implementations described herein.
Figure 2B:
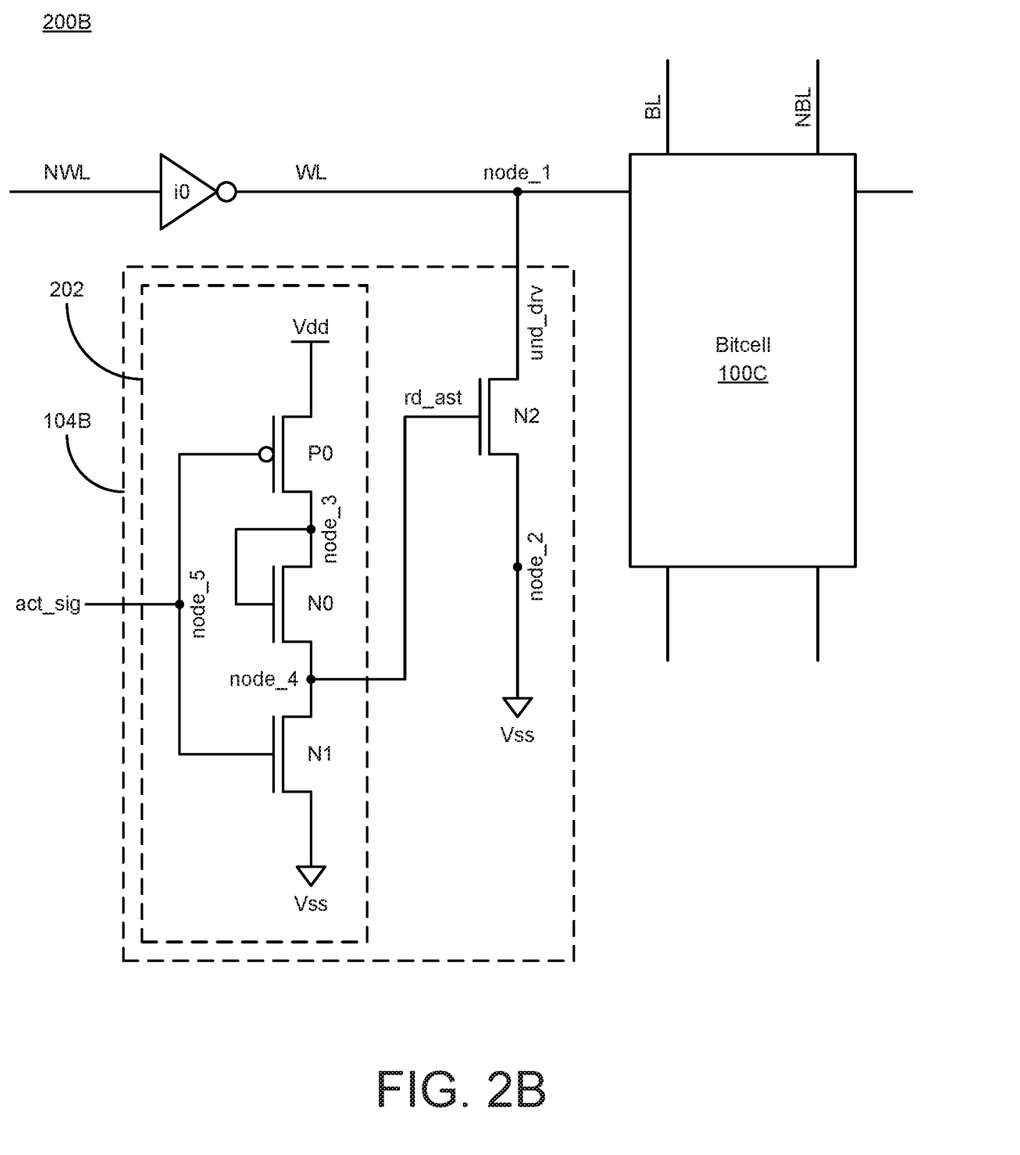
Figure 2C:
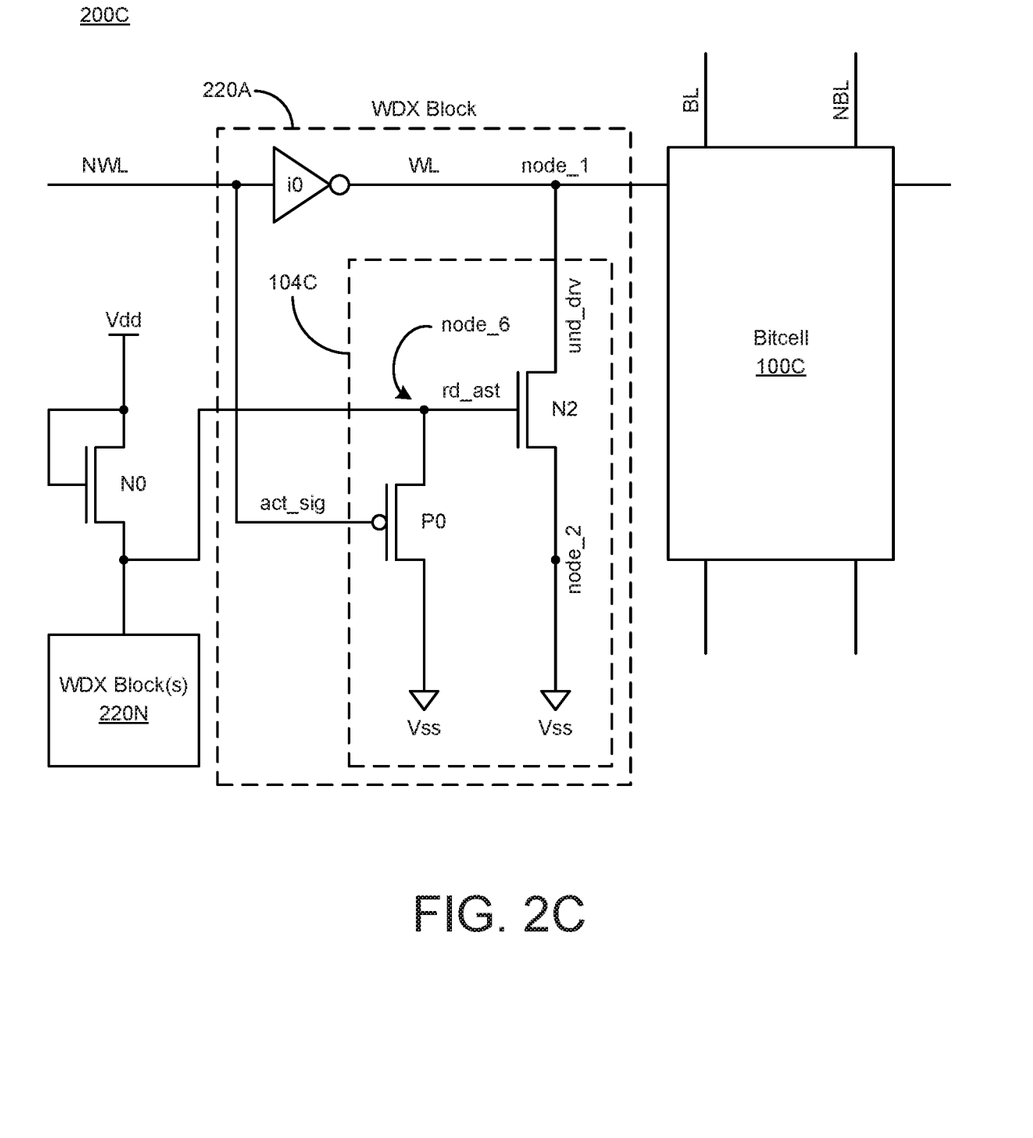
Figure 2D:
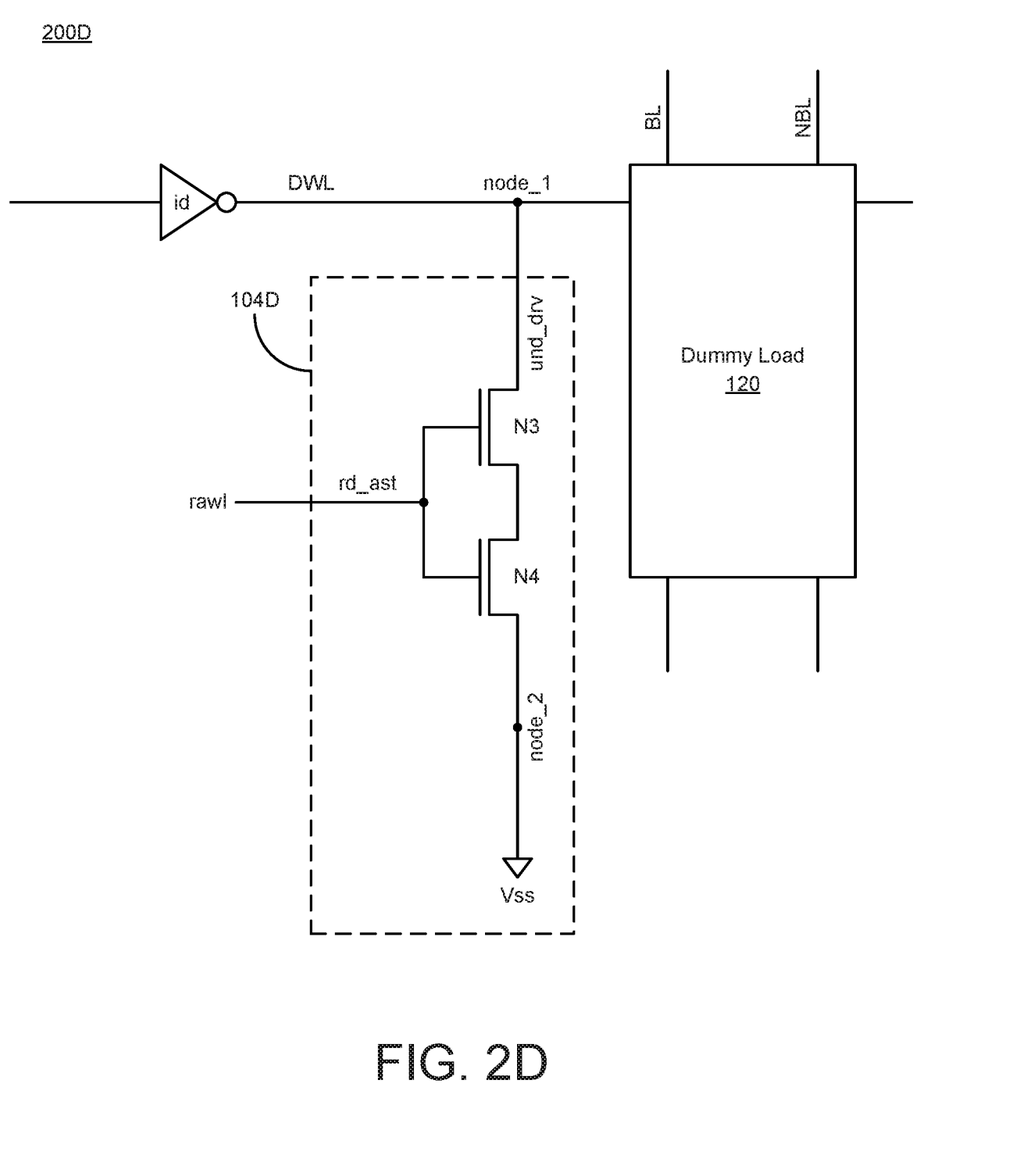

FIGS. 2A-2D illustrate various schematic diagrams 200A, 200B of read assist circuitry 104 in accordance with various implementations described herein. In particular, FIG. 2A illustrates a first schematic diagram 200A of a first implementation of read assist circuitry 104A, FIG. 2B illustrates a second schematic diagram 200B of a second implementation of read assist circuitry 104B, and FIG. 2C illustrates a third schematic diagram 200C of a third implementation of read assist circuitry 104C. Further, FIG. 2D illustrates a fourth schematic diagram 200D of a fourth implementation of read assist circuitry 104D coupled to a dummy wordline dwl.

In some implementations, as shown in FIG. 2A, the read assist circuitry 104A may include at least one wordline driver (e.g., inverter i0) coupled to the bitcell 100C via the wordline NWL, WL. The read assist circuitry 104A may include a read assist transistor N2 coupled to the wordline WL between the wordline driver i0 and the bitcell 100C at a first node node_1. In some scenarios, while activated, the read assist transistor N2 may generate an underdrive (e.g., underdrive signal und_drv) on the wordline WL when the wordline WL is selected and driven by the wordline driver i0. Further, while activated, the read assist transistor N2 may further provide a direct current (DC) path when the wordline WL is selected and driven by the wordline driver i0. In some implementations, while activated, the read assist transistor N2 may generate an adaptive underdrive (e.g., underdrive signal und_drv) on the wordline WL, wherein the level of which may depend on the process, temperature and voltage (PVT) of operation of the memory (i.e., the bitcell), when the wordline WL is selected and driven by the wordline driver i0.

As shown, the read assist transistor N2 may be coupled to the wordline WL at the first node node_1 between the wordline driver i0 and the bitcell 100C, and the read assist transistor N2 may also be coupled between the wordline WL at the first node node_1 and a negative voltage supply (Vss) at a second node node_2. The negative voltage supply (Vss) may refer to ground (GND) having zero voltage (i.e., 0V). In some instances, the read assist transistor N2 may comprise an n-type metal-oxide-semiconductor (NMOS) transistor. In other instances, the read assist transistor N2 may comprise a p-type MOS (PMOS) transistor. Further, as shown, the read assist transistor N2 may be activated with a read assist signal rd_ast that is provided by, e.g., a positive voltage supply (Vdd).

In FIG. 2A, the read assist circuitry 104A may be used to generate underdrive on the wordline. In some scenarios, a PMOS transistor may be used for the read assist transistor N2; however, in this scenario, underdrive on the wordline typically degrades the read and write margin. Thus, in FIG. 2A, instead of using a PMOS transistor, the read assist circuitry 104A uses an NMOS transistor for the read assist transistor N2, which may be referred to as a bleeder device. In this scenario, use of the NMOS transistor N2 may achieve a first level of PVT adaptability. To further improve read assist adaptability, read assist activation circuitry may be used to generate the read assist signal rs_ast, as shown and described herein below in reference to FIG. 2B.

In some implementations, as shown in FIG. 2B, the read assist circuitry 104B may include read assist activation circuitry 202, wherein the read assist transistor N2 may be activated with a read assist signal rd_ast that is provided by the read assist activation circuitry 202. The read assist activation circuitry 202 may include one or more transistors arranged to receive an activation signal act_sig and provide the read assist signal rd_ast when the wordline NWL, WL is selected. The activation signal act_sig may be provided by the positive voltage supply (Vdd). The one or more transistors may include multiple stacked transistors that are coupled between the positive voltage supply (Vdd) and the negative voltage supply (Vss), and the multiple stacked transistors may include a PMOS transistor P0 stacked on two NMOS transistors N0, N1. The PMOS transistor P0 may be coupled between the positive voltage supply (Vdd) and a first NMOS transistor N0 at a third node node_3. The first NMOS transistor N0 may be coupled between the PMOS transistor P0 at the third node node_3 and a second NMOS transistor N1 at a fourth node node_4. As shown in FIG. 2B, the first NMOS transistor N0 is coupled as a diode.

The second NMOS transistor N1 may be coupled between the first NMOS transistor N0 at the fourth node node_4 and the negative voltage supply (Vss). The PMOS transistor P0 and the second NMOS transistor N1 may be activated with the activation signal act_sig received at a fifth node node_5. Further, the first NMOS transistor N0 may be activated with an output of the PMOS transistor P0 at the third node node_3, and the read assist signal rd_ast may be provided with an output of the first NMOS transistor N0 at the fourth node node_4.

In reference to FIG. 2B, a second level of PVT adaptability may be achieved if a gate of the NMOS based read assist transistor N2 is controlled by an analog voltage, such as, e.g., the activation signal act_sig. In some instances, this PVT adaptability may be achieved by using a diode connected NMOS (e.g., N0) to control the gate of the bleeder NMOS transistor N2. In FIG. 2B, the activation signal act_sig may be normally high. However, when NWL goes to 0, WL is going to be selected high, the activation signal act_sig may go low thereby activating the PMOS transistor P0. Due to the diode-connected bleeder NMOS transistor N2, the gate of the bleeder NMOS transistor N2 rises to (vdd-vtn). Vtn is inversely proportional to process, voltage and temperature (PVT). Presently, fast PVTs are prone to ADM failures which may be compensated for by using read assist circuitry with some penalty on performance. The performance may be affected at some or all PVTs, e.g., even at PVTs where the ADM issue does not exist (e.g., slow PVT). The circuit presented as 200B in FIG. 2B may be able to inhibit or even prevent the wordline underdrive at slow PVTs, thus improving performance, while ensuring wordline underdrive at ADM critical corners.

In some implementations, as shown in FIG. 2C, the diagram 200C includes a WDX block 220A that includes the read assist circuitry 104C along with the wordline driver (e.g., inverter i0) coupled to the bitcell 100C via the wordline NWL, WL. The read assist circuitry 104C includes the read assist transistor N2 coupled to the wordline WL between the wordline driver i0 and the bitcell 100C at the first node node_1. In some scenarios, while activated, the read assist transistor N2 may generate an underdrive (e.g., underdrive signal und_drv) on the wordline WL when the wordline WL is selected and driven by the wordline driver i0. While activated, the read assist transistor N2 may further provide a direct current (DC) path when the wordline WL is selected and driven by the wordline driver i0. The read assist transistor N2 is coupled to the wordline WL at the first node node_1 between the wordline driver i0 and the bitcell 100C, and the read assist transistor N2 is coupled between the wordline WL at the first node node_1 and Vss at the second node node_2. The read assist transistor N2 may comprise an NMOS transistor. In other instances, the read assist transistor N2 may comprise PMOS transistor. Further, the read assist transistor N2 may be activated with the read assist signal rd_ast, which is provided by the transistor N0 that is coupled as a diode between the positive voltage supply (Vdd) and one or more other WDX blocks 220N.

In some implementations, as shown in FIG. 2C, the read assist circuitry 104C is activated with the read assist signal rd_ast, which is provided by the transistor N0 (coupled as a diode) to the read assist transistor N2. Therefore, the read assist transistor N2 may be activated with the read assist signal rd_ast that is provided by the transistor N0 (coupled as a diode) between the positive voltage supply (Vdd) and the read assist transistor N2. Further, the read assist circuitry 104C may include at least one transistor P0 that is arranged to receive the activation signal act_sig from the wordline NWL and that allows the transistor N0 (coupled as a diode) to provide the read assist signal rd_ast to the read assist transistor N2 when the wordline NWL is selected. The activation signal act_sig may be provided by positive voltage supply (Vdd) via the transistor N0 (coupled as a diode). The transistor P0 is coupled between a sixth node node_6 and the negative voltage supply (Vss), and the transistor may include a PMOS transistor. The gate of the PMOS transistor P0 is coupled to the wordline NWL before the wordline driver i0.

The operation principle of the read assist circuitry 104C may provide for double PVT adaptability by biasing the bleeder NMOS transistor N2 along with an improved biasing sequence. The bleeder NMOS N2 may be biased close to (vdd-vtn) in standby, and the bleeder NMOS N2 may switch to a lower voltage level when the wordline WL is turning ON. This biasing and switching may operate to inhibit or prevent the wordline WL from reaching 100% Vdd level while turning ON. The final bleeder bias level of the bleeder NMOS N2 may be higher for FS and lower for SF. In some implementations, biasing may be determined by having the diode connected big NMOS N2 (e.g., one for say 256 rows) and default-off small PMOS transistors in each rowdec. When a particular wordline WL is being selected, a corresponding PMOS in that rowdec also turns ON.

Process variation may be used as a naming convention for describing process points with a first position and a second position of the process point. For instance, an SF process point refers to detecting, in a first position (S), slower N-type MOS transistors of the first transistors of an N-type of the multiple types and to detecting, in a second position (F), faster P-type MOS transistors of the first transistors of a P-type of the multiple types. In another instance, process variation may refer to detecting another process point when the process variation has skewed sufficiently to a FS process point. In this instance, the FS process point refers to detecting, in the first position (F), faster N-type MOS transistors of the first transistors of an N-type of the multiple types and to detecting, in the second position (S), slower P-type MOS transistors of the first transistors of a P-type of the multiple types. This convention of 'S' and 'F' may be used by foundries to model the effect of variations when manufacturing MOS transistors. At process corners where a particular transistor is slow (S), a threshold voltage (Vt) of the transistor may be modelled as higher than a typical Vt, to thereby include one or more or all manufacturing effects (variations) that may reduce drain current of the transistor than what may be typically expected. At process corners where a particular transistor is fast (F), the threshold voltage (Vt) of the transistor may be modelled as lower than a typical Vt, to thereby include one or more or all manufacturing effects (variations) that may increase the drain current of the transistor to a value higher than what may be typically expected.

FIG. 2D shows an implementation of the read assist circuitry 104D coupled to the dummy wordline DWL. The implementation of FIG. 2D is used in association with FIG. 1B. As shown in FIG. 2D, the read assist circuitry 104D may include the wordline driver id coupled to a memory cell structure 120 via the wordline dwl. The wordline dwl may be referred to as a dummy wordline, and the wordline driver id may be referred to as a dummy wordline driver.

The read assist circuitry 104D may include one or more read assist transistors N3, N4 that are coupled to the wordline dwl between the wordline driver id and the memory cell or dummy load 120. The one or more read assist transistors N3, N4 may be activated with a read assist signal rd_ast, which may be referred to as a rawl signal (i.e., read assist on wordline signal). While activated, the one or more read assist transistors N3, N4 may generate an underdrive on the wordline dwl to delay a rising edge of a wordline signal that is provided by the wordline driver id on the wordline dwl. The read assist signal rd_ast (i.e., rawl) rise during underdrive of the wordline dwl. Further, the one or more read assist transistors N3, N4 may include a stack of multiple transistors (e.g., two NMOS transistors) that may be coupled between the wordline dwl at node_1 and the negative voltage supply (Vss) at node_2, which may refer to ground (GND) having zero voltage.

During read and/or write operations, the rise of an external clock signal (e.g., CLK) from an SOC (system-on-a-chip) triggers the fall of the NGTP (negative global timing pulse) and rise of the GTP (global timing pulse). For instance, NGTP fall triggers DWL rise. DWL signal travels in a direction of the actual wordline WL through input/output (IO) circuitry. The DWL routing and load may be mimicked in the IOs to that which is seen by the actual wordline WL in the bitcells. DWL signal returning from the IOs may refer to a DWL_TURN, which triggers the DBL fall. The DBL signal may be loaded with capacitance to match that which is seen by the actual bitline BL in the bitcell.

In some scenarios, when the read assist feature is turned ON by enabling the wordline WL underdrive, read and write timing may degrade significantly leading to loss of read/write margins. As shown, FIG. 2D may be implemented for the dummy wordline driver circuitry to mimic the WLUD (wordline underdrive) on the actual wordline WL as shown in FIG. 1B. In this instance, the dummy wordline DWL may capture any process variation on the actual WL slope or level with WLUD. The RAWL signal (Read Assist on WL) signal may rise during WLUD, turning on the NMOS transistors N3, N4 and slowing down the DWL rising edge. Further, the dummy wordline DWL may not reach full rail due to the constant current discharge path provided by the NMOS transistors N3, N4. Sometimes, this may further slowdown the DBL pulldown circuit. This mimics the actual slowdown in the bitcell access due to WL not reaching full rail. In some cases, the scheme may have no performance penalty during WLUD off, as the NMOS transistors N3, N4 in the stack may be turned off, thereby enabling a normal DWL pulse.

Figure 3A:
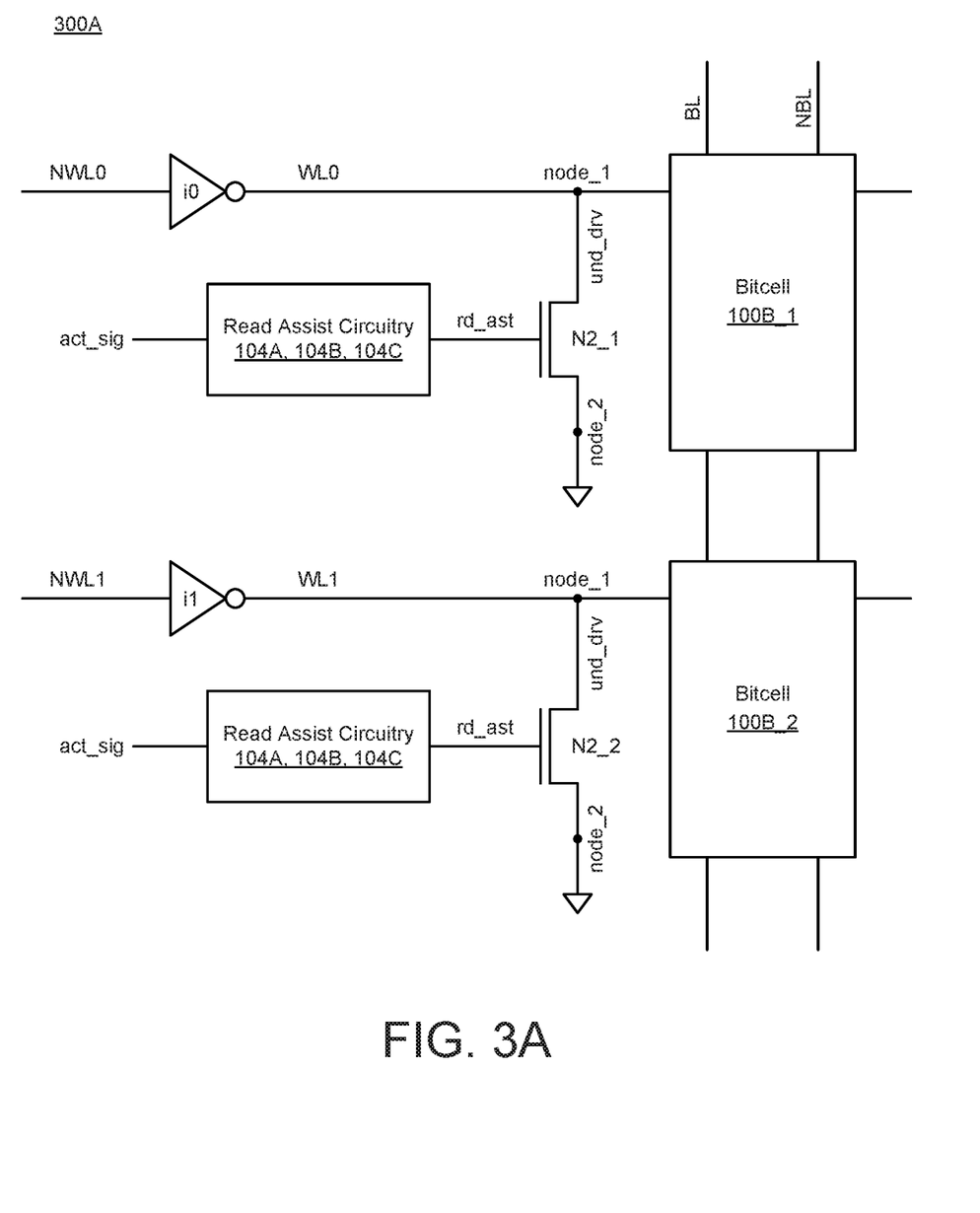
FIGS. 3A-3B illustrate various diagrams of read assist circuitry in accordance with various implementations described herein.
Figure 3B:
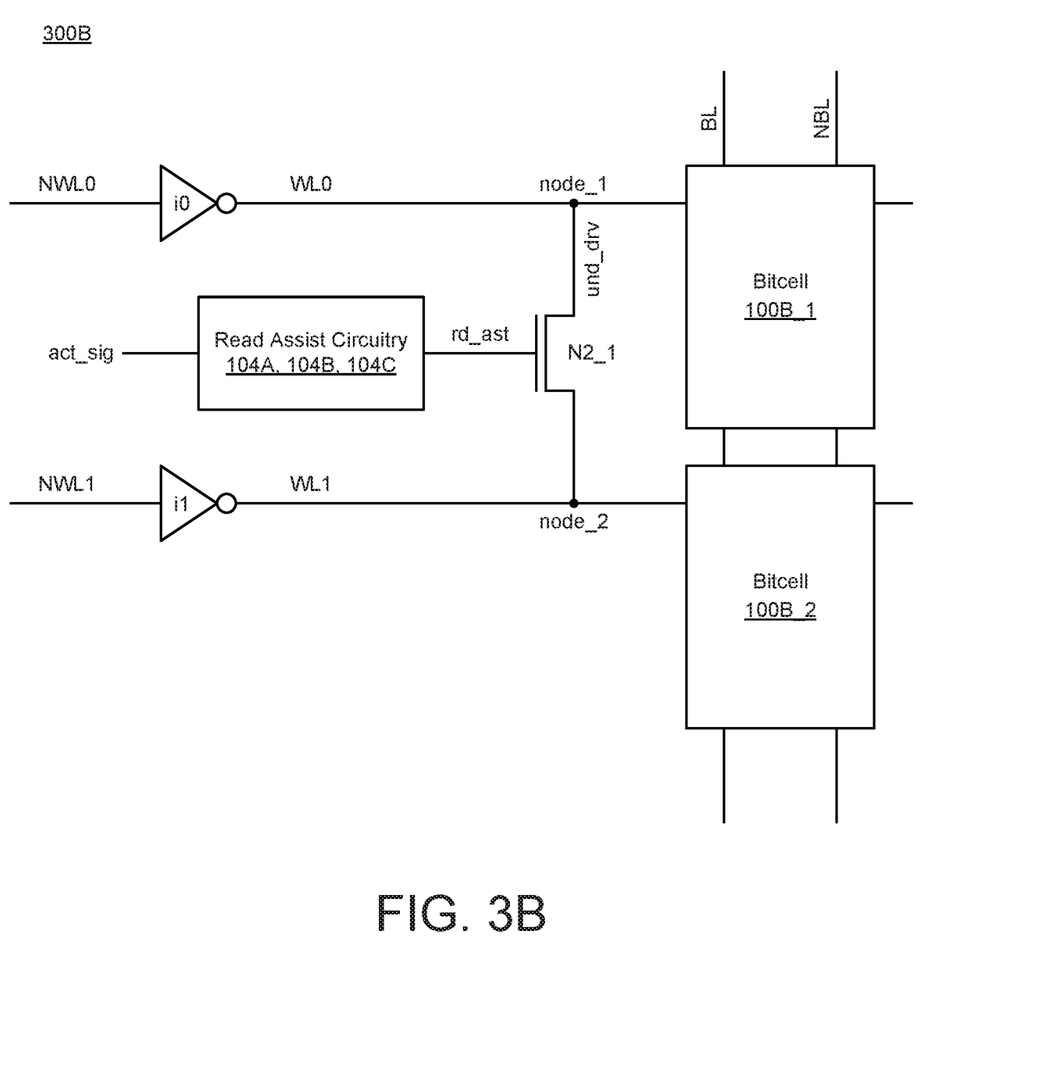

FIGS. 3A-3B illustrate various schematic diagrams 300A, 300B of read assist circuitry 104 in accordance with various implementations described herein. In particular, FIG. 3A illustrates a first schematic diagram 300A of a first implementation of read assist circuitry 104A, 104B, and FIG. 3B illustrates a second schematic diagram 300B of a second implementation of read assist circuitry 104A, 104B.

In some implementations, as shown in FIG. 3A, a first read assist transistor N2_1 may be coupled to a first wordline NWL0, WL0 at a first node node_1 between a first wordline driver i0 and a first bitcell 100C_1, and further, the first read assist transistor N2_1 may also be coupled between the first wordline NWL0, WL0 at the first node node_1 and the negative voltage supply (Vss) at the second node node_2. Similarly, a second read assist transistor N2_2 may be coupled to a second wordline NWL1, WL1 at another first node node_1 between a second wordline driver i1 and a second bitcell 100C_2, and further, the second read assist transistor N2_2 may also be coupled between the second wordline NWL1, WL1 at the another first node node_1 and the negative voltage supply (Vss) at another second node node_2.

As described herein above in reference to FIG. 1A, the wordline NWL0 may be selected with a particular address. The wordline driver (e.g., inverter i0) may generate a complementary wordline signal WL0, and this is how the passgates of a row in memory are coupled to the output (WL0) of the wordline driver i0. In various applications, the read assist transistor N2 may be coupled to Vss (FIG. 3A) or another wordline (FIG. 3B).

In some implementations, as shown in FIG. 3B, the first read assist transistor N2_1 may be coupled to the first wordline NWL0, WL0 at the first node node_1 between the first wordline driver i0 and the first bitcell 100C_1, and the first read assist transistor N2_1 may also be coupled between the first wordline NWL0, WL0 at the first node node_1 and the second wordline NWL1, WL1 at the second node node_2. Further, as shown, the second node node_2 is disposed at the second wordline NWL1, WL1 between the second wordline driver i1 and the second bitcell 100C_2.

As shown in reference to FIGS. 3A, 3B, the read assist circuitry 104A, 104B may be used in designs where the read assist transistor N2 is coupled to Vss (FIG. 3A) or to another wordline (FIG. 3B). However, the choice of the design may depend on a size of the read assist transistor N MOS N2 and the designer.

Figure 4:
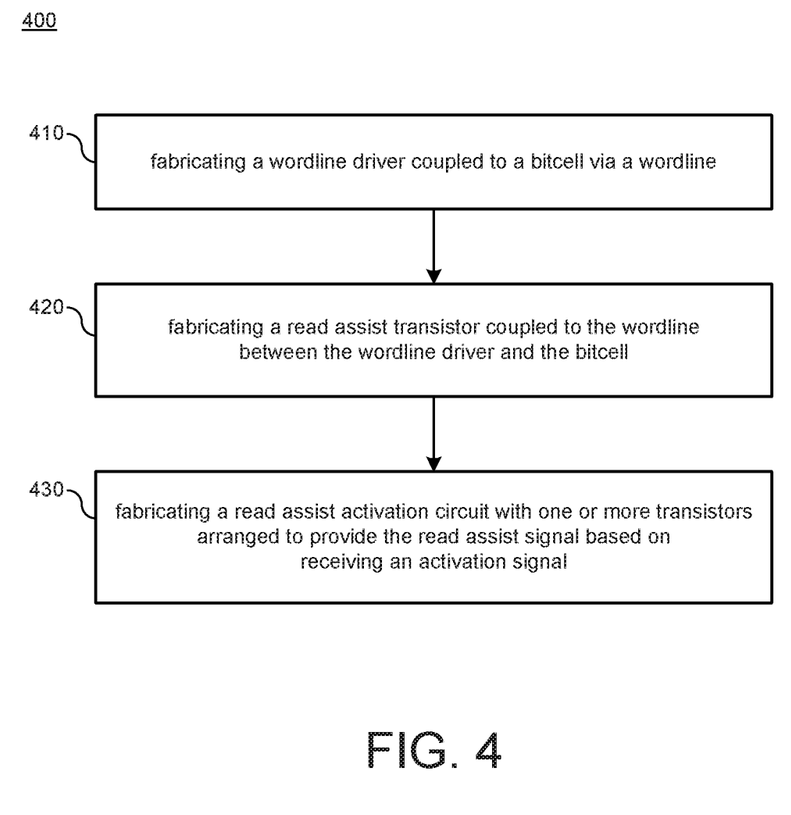
FIG. 4 illustrates a process flow of a method of fabricating read assist circuitry in accordance with various implementations described herein.

FIG. 4 illustrates a process flow diagram of a method for 400 fabricating read assist circuitry in accordance with various implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Further, method 400 may be implemented in hardware and/or software. If implemented in hardware, the method 300 may be implemented with various circuit components, such as described herein above in reference to FIGS. 1A-3B. If implemented in software, the method 400 may be implemented as a program or software instruction process that may be configured for read assist circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing an integrated circuit (IC) that implements read assist circuitry in various types of memory applications. For instance, as described herein, method 400 may be utilized for manufacturing read assist circuitry for memory applications, wherein the read assist circuitry may be adaptive to pressure, voltage and temperature (PVT).

At block 410, method 400 may fabricate a wordline driver coupled to a bitcell via a wordline. The wordline driver may be implemented with an inverter. The bitcell may be referred to as a memory cell, and the bitcell may be implemented with various types of SRAM cells, such as, e.g., 6T CMOS SRAM and/or other types of complementary MOS (CMOS) SRAM cells, such as, e.g., 4T, 8T, 10T, or more transistors per bit.

At block 420, method 400 may fabricate a read assist transistor coupled to the wordline between the wordline driver and the bitcell. In some implementations, the read assist transistor may be activated with a read assist signal, and while activated, the read assist transistor may generate an underdrive on the wordline, e.g., when the wordline is selected and driven by the wordline driver. In some instances, while activated, the read assist transistor may further provide a DC path when the wordline is selected and driven by the wordline driver.

In some implementations, the read assist transistor may be coupled to the wordline at a first node between the wordline driver and the bitcell, and the read assist transistor is also coupled between the wordline at the first node and a negative voltage supply (Vss) at a second node node_2. The negative voltage supply (Vss) may refer to ground (GND) having zero voltage (i.e., 0V). In other implementations, the read assist transistor may be coupled to the wordline (as a first wordline) at a first node between the wordline driver and the bitcell, and the read assist transistor may also be coupled between the first wordline at the first node and a second wordline at a second node node_2. Further, the read assist transistor may be implemented with an NMOS transistor.

At block 430, method 400 may fabricate a read assist activation circuit having one or more transistors arranged to provide the read assist signal based on receiving an activation signal. In some implementations, the one or more transistors may be implemented with multiple stacked transistors that are coupled between a positive voltage supply (Vdd) and a negative voltage supply (Vss), and the multiple stacked transistors may include a PMOS transistor stacked on two NMOS transistors. The PMOS transistor may be coupled between the positive voltage supply (Vdd) and a first NMOS transistor. The first NMOS transistor may be coupled between the PMOS transistor and a second NMOS transistor. The second NMOS transistor may be coupled between the first NMOS transistor and the negative voltage supply (Vss). The PMOS transistor and the second NMOS transistor may be activated with the activation signal, and the first NMOS transistor may be activated with an output of the PMOS transistor. Further, the read assist signal may be provided with an output of the first NMOS transistor.

Described herein are various implementations of an integrated circuit. The integrated circuit may include a wordline driver coupled to a bitcell via a wordline. The integrated circuit may include a read assist transistor coupled to the wordline between the wordline driver and the bitcell. While activated, the read assist transistor may generate an underdrive on the wordline when the wordline is selected and driven by the wordline driver. In some implementations, while activated, the read assist transistor may generate an adaptive underdrive on the wordline, the level of which depends on the process, temperature and voltage (PVT) of operation of the memory (i.e., the bitcell), when the wordline is selected and driven by the wordline driver.

Described herein are various implementations of an integrated circuit. The integrated circuit may include a wordline driver coupled to a memory cell via a wordline. The integrated circuit may include one or more read assist transistors coupled to the wordline between the wordline driver and the memory cell. The one or more read assist transistors may be activated with a read assist signal, and while activated, the one or more read assist transistors may generate an underdrive on the wordline to delay a rising edge of a wordline signal that is provided by the wordline driver on the wordline.

Described herein are various implementations of a method for manufacturing an integrated circuit. The method may include fabricating a wordline driver coupled to a bitcell via a wordline. The method may include fabricating a read assist transistor coupled to the wordline between the wordline driver and the bitcell. The read assist transistor may be activated with a read assist signal, and while activated, the read assist transistor may generate an underdrive on the wordline when the wordline is selected and driven by the wordline driver. The method may include fabricating a read assist activation circuit having one or more transistors arranged to provide the read assist signal based on receiving an activation signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting

[the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a wordline driver coupled to a bitcell via a wordline; and
   a read assist transistor coupled to the wordline between the wordline driver and the bitcell,
   wherein the read assist transistor is controlled based on an analog activation signal,
   wherein, while activated, the read assist transistor generates an underdrive on the wordline when the wordline is selected and driven by the wordline driver,
   wherein the read assist transistor is activated with a read assist signal provided by read assist activation circuitry having multiple transistors including a p-type metal-oxide-semiconductor (PMOS) transistor, a first n-type MOS (NMOS) transistor coupled as a diode and a second NMOS transistor that are arranged to provide the read assist signal at a node disposed between the first NMOS transistor and the second NMOS transistor.

2. The integrated circuit of claim 1, wherein the read assist transistor is coupled to the wordline at a first node between the wordline driver and the bitcell, and wherein the read assist transistor is also coupled between the wordline at the first node and a negative voltage supply (Vss) at a second node.

3. The integrated circuit of claim 2, wherein the negative voltage supply (Vss) refers to ground (GND) having zero voltage.

4. The integrated circuit of claim 1, wherein the read assist transistor comprises an n-type metal-oxide-semiconductor (NMOS) transistor.

5. The integrated circuit of claim 1, wherein the wordline driver comprises an inverter.

6. The integrated circuit of claim 1, wherein, while activated, the read assist transistor further provides a direct current (DC) path when the wordline is selected and driven by the wordline driver.

7. The integrated circuit of claim 1, wherein the multiple transistors of the read assist activation circuitry are arranged to receive an activation signal and provide the read assist signal when the wordline is selected.

8. The integrated circuit of claim 7, wherein the multiple transistors comprise multiple stacked transistors that are coupled between a positive voltage supply (Vdd) and a negative voltage supply (Vss), and wherein the multiple stacked transistors include the PMOS transistor stacked on the two NMOS transistors.

9. The integrated circuit of claim 1, wherein the PMOS transistor is coupled between the positive voltage supply (Vdd) and the first NMOS transistor, and wherein the first NMOS transistor is coupled between the PMOS transistor and the second NMOS transistor, and wherein the second NMOS transistor is coupled between the first NMOS transistor and the negative voltage supply (Vss).

10. The integrated circuit of claim 1, wherein the PMOS transistor and the second NMOS transistor are activated with the activation signal, and wherein the first NMOS transistor is coupled as a diode and activated with an output of the PMOS transistor.

11. The integrated circuit of claim 1, wherein the analog activation signal is based on at least one of a clock signal, a chip enable signal, and an address signal.

12. An integrated circuit, comprising:
    a wordline driver coupled to a bitcell via a first wordline; and
    a read assist transistor coupled to the first wordline between the wordline driver and the bitcell, wherein the read assist transistor is controlled based on an analog activation signal,
    wherein, while activated, the read assist transistor generates an underdrive on the first wordline when the first wordline is selected and driven by the wordline driver,
    wherein the read assist transistor is coupled to the first wordline at a first node between the wordline driver and the bitcell, and wherein the read assist transistor is also coupled to a plurality of other wordlines.

13. An integrated circuit, comprising:
    a wordline driver coupled to a bitcell via a wordline;
    a read assist transistor coupled to the wordline between the wordline driver and the bitcell; and
    a first transistor coupled between a gate of the read assist transistor and a negative voltage supply (Vss),
    wherein, while activated, the first transistor is activated with an activation signal provided by the wordline,
    wherein, while activated, the read assist transistor generates an underdrive on the wordline when the wordline is selected and driven by the wordline driver,
    wherein the read assist transistor is activated with a read assist signal provided by a second transistor coupled as a diode between a positive voltage supply (Vdd) and the gate of the read assist transistor, and
    wherein a gate of the first transistor receives the activation signal from the wordline at a node disposed before the wordline driver, and wherein the first transistor allows the second transistor that is coupled as a diode to provide the read assist signal to the read assist transistor when the wordline is selected.

14. The integrated circuit of claim 13, wherein the first transistor is a p-type metal-oxide-semiconductor (PMOS) transistor and the second transistor is a n-type metal-oxide-semiconductor (PMOS) transistor.

15. The integrated circuit of claim 13, wherein the read assist circuitry provides a double adoptability based on a process, temperature and voltage (PVT) of the bitcell.

16. An integrated circuit, comprising:
    a dummy wordline driver coupled to a dummy load via a dummy wordline; and
    multiple read assist transistors coupled in series between a first node on the dummy wordline between the dummy wordline driver and the dummy load and a second node connected to a negative voltage supply (Vss), wherein gates of the multiple read assist transistors are connected to an activation signal, wherein the activation signal is provided by a positive voltage supply (Vdd), and wherein the multiple read assist transistors are activated with a read assist signal, and while activated, the multiple read assist transistors generate an underdrive on the dummy wordline to delay a rising edge of a wordline signal that is provided by the dummy wordline driver on the dummy wordline.

17. The integrated circuit of claim 16, wherein the multiple read assist transistors comprise a stack of multiple transistors coupled between the dummy wordline and a negative voltage supply (Vss) that refers to ground (GND) having zero voltage, and wherein the multiple transistors comprise multiple n-type metal-oxide-semiconductor (NMOS) transistors.

18. The integrated circuit of claim 16, wherein read assist signal comprises a read assist on wordline signal that rises during underdrive of the wordline.

19. A method for manufacturing an integrated circuit, the method comprising:

fabricating a wordline driver coupled to a bitcell via a wordline;

fabricating a read assist transistor coupled to the wordline between the wordline driver and the bitcell, wherein the read assist transistor is activated with a read assist signal, and while activated, the read assist transistor generates an underdrive on the wordline when the wordline is selected and driven by the wordline driver; and fabricating a read assist activation circuit having multiple transistors arranged to receive a single activation signal and provide the read assist signal to a gate of the read assist transistor based on the single activation signal, wherein the single activation signal controls the read assist transistor based on an analog voltage.

\* \* \* \* \*